US006958606B2

(12) United States Patent
Le Roux (10) Patent No.: US 6,958,606 B2
(45) Date of Patent: Oct. 25, 2005

(54) NMR EXCITATION METHOD (75) Inventor: Patrick H. Le Roux, Palaiseau (FR)

(73) Assignee: GE Medical Systems Global Technology Co., LLC, Waukesha, WI (US)

( * ) Notice: Subject to any disclaimer, the term of this patent is extended or adjusted under 35 U.S.C. 154(b) by 0 days.

(21) Appl. No.: 10/707,292

(22) Filed: Dec. 3, 2003

(65) Prior Publication Data
US 2005/0122103 A1 Jun. 9, 2005

(51) Int. Cl.$^7$ ............................................. G01V 3/00
(52) U.S. Cl. ...................... 324/309; 324/318
(58) Field of Search ............................ 324/309, 307, 324/318, 319, 322, 300

(56) References Cited

U.S. PATENT DOCUMENTS

| | | | |
|---|---|---|---|
| 3,826,972 A | 7/1974 | Day et al. ................... | 324/307 |
| 4,390,840 A * | 6/1983 | Ganssen et al. ............ | 324/309 |
| 4,695,799 A * | 9/1987 | Hardy et al. ................ | 324/307 |
| 5,212,448 A | 5/1993 | Le Roux et al. ............ | 324/309 |
| 5,256,967 A | 10/1993 | Foo et al. ................... | 324/311 |
| 6,181,134 B1 * | 1/2001 | Wald .......................... | 324/307 |

OTHER PUBLICATIONS

R. A. De Graaf et al: "Adia batic RARE Imaging", NMR in Biomedicine, pp. 29-35, XP008023942.

Alessio Serreqi and Melvin B. Comisarow: "Frequency Interpolation of Discrete, Apodized, Magnitude Lineshapes", Applied Spectroscopy, vol. 41, No. 2, 1987, pp. 288-295.
B. A. Hargreaves, et al: "Characterization and reduction of the transient response in steady-state MR imaging", Magnetic Resonance in Medicine, vol. 46, pp. 149-158.
J. S. Blicharski: "Approaching The Steady State At Fast Adiabatic Transitions inNuclear Magnetic Resonance", ACTA Physica Polnica, vol. 36, pp. 755-761, XP008023939.
Yi Sun et al: Small Vessel Enhancement in MRA Images Using Local Maximum Mean Processing, IEE Tansactions On Image Processing, vol. 10, No. 11, Nov. 2001, pp. 1687-1699.
Patrick Le Roux: Simplified Model and Stablization of SSFP Sequences, 13$^{th}$ Aug. 2002, pp. 1-19.

* cited by examiner

Primary Examiner—Brij B. Shrivastav
(74) Attorney, Agent, or Firm—Peter J. Vogel (57) ABSTRACT

A method of excitation for use during an NMR examination includes the subjecting of a body (92) to an orienting magnetic field (B0). The body (92) is adiabatically conditioned with a first series of Rf pulses ($IP_1$–$IP_n$). The body (92) is excited with a second series of RF pulses ($E_1$–$E_m$) in a presence of gradient field pulses. A resonance signal is emitted from the body (92) in response to the second series of RF pulses ($E_1$–$E_m$).

23 Claims, 6 Drawing Sheets

NMR EXCITATION METHOD

CROSS-REFERENCE TO RELATED APPLICATION

The present application claims priority from the France Non-Provisional Patent Application Serial No. FR no 03 50018, filed in France on Jun. 2, 2003, entitled "METHOD OF EXCITATION DURING AN NMR EXAMINATION," and incorporated herein by reference.

BACKGROUND OF INVENTION

In the field of nuclear magnetic resonance (NMR) several types of examinations have been utilized to provide fast and accurate imaging. During a typical NMR examination a patient is subjected to a uniform, intense, continuous, magnetic field, which is sometimes referred to as an orienting field. Magnetization of molecular protons within a body of the patient, especially those contained within hydrogen atoms or water molecules, are oriented along an applied direction of the orienting field. The protons are then subjected to an excitation, in the form of radio frequency energy, which causes their magnetization to "flip". As the magnetization of the protons return to the original direction of magnetization a precession signal is generated, measured, and processed. The precession signal essentially provides density information of the different materials of the body being examined. In general, the materials having a greater amount of hydrogen provide a stronger contribution to the precession or response signal.

Generally, all the parts of the body that are subjected to the excitation respond simultaneously. As such, the response signal is generated in response to all of the molecules within the body parts that return to equilibrium after excitation. To discriminate between the contributions provided by each of the body parts, it is necessary to encode the excitation signal and decode the response signal. Encoding includes reiteration of the excitation signal and thus generation of the response signal. As many different encoding and measurement operations are needed as there are pixels in an image to be reconstructed. The reiteration of the excitation and response signals increases time to acquire an image due to the duration of each excitation and response sequence.

Two fast sequencing techniques that are used to decrease imaging time are fast spin echo (FSE) and steady-state free precession (SSFP). Time available to perform the sequences of FSE, SSFP, and the like is limited. For example, the time to perform a couple of excitations and signal acquisitions can be reduced down to 3 ms. It is the advent of compensated gradient coils, which eliminate eddy current effects, that enables the acquisition of data at this fast rate.

Figure 1:
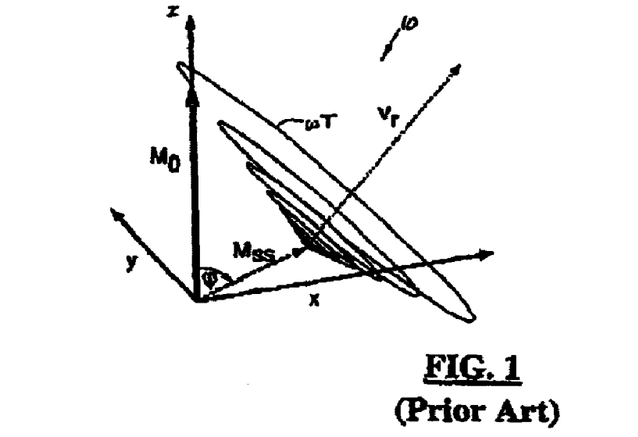
FIG. 1 is a Cartesian coordinate system diagram illustrating a transient response of magnetization from an initial magnetization $M_0$ to a steady-state magnetization $M_{SS}$ for an application of SSFP.

Referring now to FIG. 1, a Cartesian coordinate system diagram 10 illustrating a transient response of magnetization from an initial magnetization $M_0$ to a steady-state magnetization $M_{SS}$ for an application of SSFP is shown. The orienting field B0 is applied along the z-axis. Magnetization at rest and before excitation of the cells under examination, due to the orienting field B0, is represented by vector $M_0$. After a certain number of RF excitation pulses, magnetization is oriented to the steady-state magnetization $M_{SS}$. The steady-state magnetization $M_{SS}$ is at a tilt angle $\psi$ from the magnetization at rest $M_0$. The real-valued eigenvector $v_r$ is shown. The component of the transient response, which is directed along $v_r$ decays exponentially (and is not shown). The component that is orthogonal to $v_r$ decays along a circular spiral path, designated as $w_T$, in the plane approximately orthogonal to $v_r$.

The value of the tile angle $\psi$ depends upon various factors, such as the relaxation times T1 and T2 of the body cells being examined. The time T1 is a time constant corresponding to the exponential recovery of the longitudinal magnetization component of the cells that are aligned with the magnetic field B0. The time T2 is a time constant corresponding to the exponential decrease or decay in the transverse magnetization component of the cells. After preparation of the steady-state magnetization $M_{SS}$ a large number of excitations and measurements can be performed.

The steady-state magnetization $M_{SS}$, for the fast sequences, is not reached quickly from the application of RF pulses. The steady-state magnetization $M_{SS}$ is attained only after a large number of RF pulses have been applied, corresponding to a length of time that is approximately three or four times the duration of the time T1. The duration of the combined pulses is greater than the duration of a measurement. In other words, the steady-state magnetization $M_{SS}$ is not attained for a short duration measurement. As a result, the beginning of each excitation signal or burst is not at steady-state equilibrium and a long transient unstabilized signal exists during which no useful data can be acquired.

Also, since the direction of the steady-state magnetization vector $M_{SS}$ depends from T1 divided by T2 or the inverse, image generation using the stated technique is not particularly useful for the examination of a brain. The stated technique is useful in other tissue examinations, such as in cardiac type examinations. However, in the cardiac field, the stated fast sequences require an undesirable length of time to perform. The cyclical character motion of the heart correspondingly requires that the measurements performed be assigned to a particular time in the cardiac cycle and to a precise position in a section of the heart. For example, when sequences are performed for 30 sections of the heart they must be assigned to a cardiac phase among 15 possible phases. In so doing, acquisition must correspond to the measurement of 450 sections. In practice, even at high working speeds, this acquisition can take more than 2 min. Unfortunately, pulse stability of the heart is not acquired over such a long duration.

Two methods have been introduced in an attempt to stabilize material magnetization and decrease sequence performance time. However, these methods have been shown to be imperfect, complicated, and not robust. In the first method a series of six preparation pulses are utilized. The duration of each excitation pulse can be approximately 2 ms in duration. Little time remains for performing a measurement in a total limited time duration of 3 ms. Also, the preparation for the steady-state magnetization is highly sensitive to the calibration of the excitation, thus, rendering it not robust for industrial-scale applications.

In the second method, the steady-state magnetization is attained by applying a series of RF pulses that have amplitudes, which increase linearly and at a constant pitch from pulse to pulse. Unfortunately, although in theory the tilt angle $\psi$ is attained at the end of the RF pulses, in reality an oscillation remains in the perpendicular component of the magnetization. While the oscillation remains accurate data cannot be obtained. Thus, one must wait until the oscillation dampens before acquiring the data. As a result of the oscillation, time to reach steady-state magnetization and imaging time remains longer than desired. The two methods and their associated disadvantages are described in greater detail below in the Detailed Description.

Thus, there exists a need for an improved NMR excitation method that allows for the performance of fast NMR sequences, which is accurate, simple, and robust, and provides decreased imaging time.

SUMMARY OF INVENTION

The present invention provides a system and method of excitation for use during an NMR examination. The method includes the subjecting of a body to an orienting magnetic field. The body is adiabatically conditioned with a first series of RF pulses. The body is excited with a second series of RF pulses in a presence of gradient field pulses. A resonance signal is emitted from the body in response to the second series of RF pulses.

The embodiments of the present invention provide several advantages. One such advantage provided by several embodiments of the present invention is the provision of a simple, robust, and precise excitation method.

Another advantage that is provided by multiple embodiments of the present invention is the provision of a series of adiabatic preparation RF pulses. In the application of the adiabatic RF pulses, the stated embodiments minimize the number of RF pulses applied and the time to attain a magnetization equilibrium before the performance of a series of excitation-measurement sequences.

The present invention itself, together with attendant advantages, will be best understood by reference to the following detailed description, taken in conjunction with the accompanying figures.

BRIEF DESCRIPTION OF DRAWINGS

For a more complete understanding of this invention reference should now be had to the embodiments illustrated in greater detail in the accompanying figures and described below by way of examples of the invention wherein.

DETAILED DESCRIPTION

Recently, two methods have been introduced in an attempt to stabilize material magnetization and decrease sequence performance time. The first method is by Hargreaves et al. and is entitled, "Characterization and Reduction of the Transient Response in Steady-state MR Imaging", in Magnetic Resonance in Medicine 46:149–158 (2001). The second method is by D. G. Nishimura and S. S. Vasanawala and is entitled, "Analysis and Reduction of the Transient Response in SSFP Imaging", in Proceedings of the ISMRM, $8^{th}$ Annual Meeting, Denver, 2000, p. 301.

A Cartesian frame of reference is used for each of the stated methods and includes a z-axis. The orienting field B0 extends along the z-axis. The x-axis and the y-axis correspond with transversal directions. An effective referential system is used and is related to the orientation of the steady-state magnetization Mss when the steady-state is attained. At the time of the excitations and measurements during the steady-state, precessing of the protons occurs in an effective rotation about an effective direction of the steady-state magnetization $M_{SS}$ instead of the z-axis.

The precessing about the steady-state magnetization $M_{SS}$ has two components a longitudinal or parallel component and a transversal or perpendicular component. In practice, measurement coils or antennas, that are fixed to measure the signal transmitted by the body after excitation, have planes parallel to the z-axis. Consequently, both the contribution of the parallel component and the perpendicular component are measured. Each component has a non-null component in a plane perpendicular to the z-axis.

Figure 2:
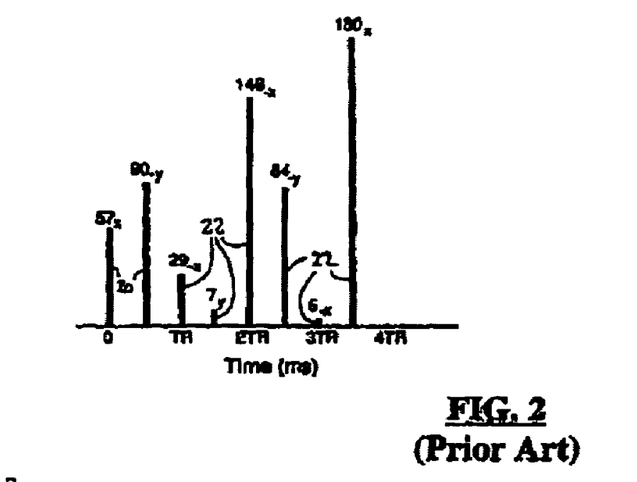
FIG. 2 is a graph of a spectrally selective catalyzing sequence of a preparation phase subsequent to a series of fast excitation-measurement sequences.

The first method of excitation includes two preparation phases, a scaling phase and a selective flipping phase. In this method, for a flip angle θ of approximately 60°, a pair of magnitude-scaling pulses 20 and a series of six preparation pulses 22 are applied, as is shown in FIG. 2. The flip angle θ for each radio frequency (RF) pulse is shown, along with the axis of tip in a rotating coordinate frame. Four of the six preparation pulses dictate flips greater than the value of a flip desired. The large flip angled pulses have associated long durations as compared with the smaller flip angled pulses.

For the first method, when a flip angle of 60° has an associated excitation pulse duration of approximately 600 μs, a flip angle of 180° has an associated excitation pulse duration of approximately 2 ms. In a total available excitation-measurement sequence of 3 ms little time remains to perform a measurement. Furthermore, the preparation for the steady-state magnetization is highly sensitive to the calibration of the excitation pulses, referred to as the signal B1, during the preparation phase.

Figure 3:
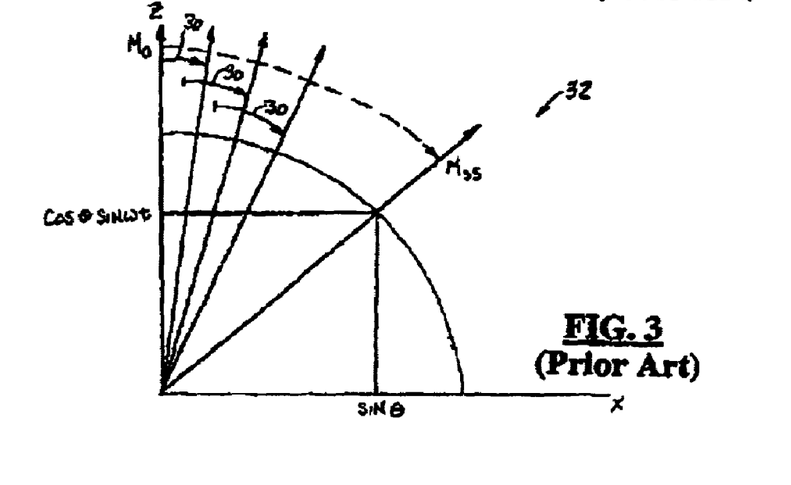
FIG. 3 is an excitation amplitude diagram for an applied series of excitation pulses illustrating a transition from an initial magnetization to steady-state magnetization.

The second method includes attaining the steady-state magnetization $M_{SS}$, from the initial magnetization $M_0$, using a series of excitation pulses 30 that have linearly increasing amplitude and a constant pitch during the preparation phase.

This is illustrated by the excitation amplitude diagram 32 of FIG. 3. The excitation pulses 30 follow each other with increasing amplitudes such that the material magnetization progresses from magnetization $M_0$ to the steady-state magnetization $M_{SS}$ in a regular manner.

Figure 4:
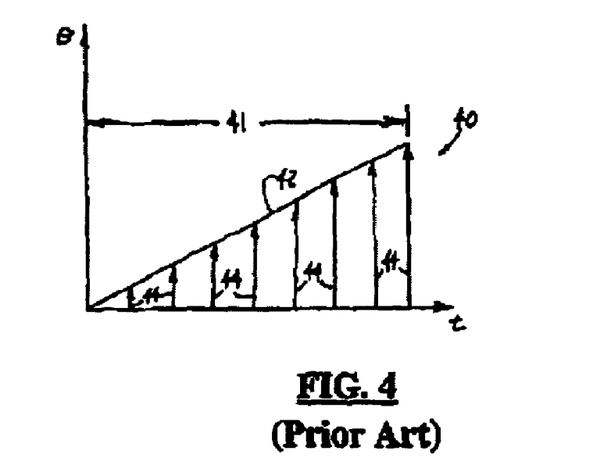
FIG. 4 is a preparation excitation sequence illustrating excitation flip angle amplitudes of a preparation phase subsequent to a series of fast excitation-measurement sequences.

FIG. 4 is a graph illustrating a preparation excitation sequence 40 for a preparation phase 41 according to the second method. A ramp 42 illustrates a linearly increasing amplitude of the excitation pulses 44, having a constant pitch. The flip angle θ increases linearly along the ramp 42 as a function of time t. At the end of the preparation phase 41, the flip angle θ, corresponding with the steady-state magnetization $M_{SS}$, is attained and measurements can then be performed. Constant change in flip angle $\Delta\theta_0$ over time t is shown by the flip angle variation curve 50 in FIG. 5A.

Thus, the steady-state magnetization Mss, in theory, can be achieved using the stated methods. However, in the actual setup, the attainability of the steady-state magnetization $M_{SS}$ can be complex. Both longitudinal and transversal magnetization components for a rotating frame of reference are considered. The transversal component can negatively affect the ability to attain the magnetization steady-state $M_{SS}$, due to the oscillations caused therefrom, which is further described below.

As opposed to dispersing the contributions of the perpendicular components, the perpendicular components may be dispersed naturally at the end of a period of time T2 due to the relaxation of the protons. However, natural dispersion is undesirable since there is a waiting period for the end of the duration time T2 to assure the value of the starting signal. Furthermore, in cardiac examinations both blood and muscle tissues are studied. Blood, being similar to water, can necessitate a long wait time for relaxation to be effective, whereas muscle may be measured much earlier due to its fast relaxation time.

The second method experiences the stated oscillations due to the constant flip angle variation throughout the preparation phase 41. FIG. 5B shows a graph illustrating the Fourier Transform of the flip angle variation curve 50. Assuming the invariant character of the value of the parallel component, it has been shown that the value of the perpendicular component is equal to the Fourier Transform of the variation in the flip angles Δθ between excitation pulses. This result is reflected in an expression of the value of the perpendicular component that is a function of frequency ω and has a form of the type sin(x)/x, as illustrated by transversal component curve 60. The frequency ω is the precession pulsation and $\omega_r$ is a reference frequency.

Figure 6:
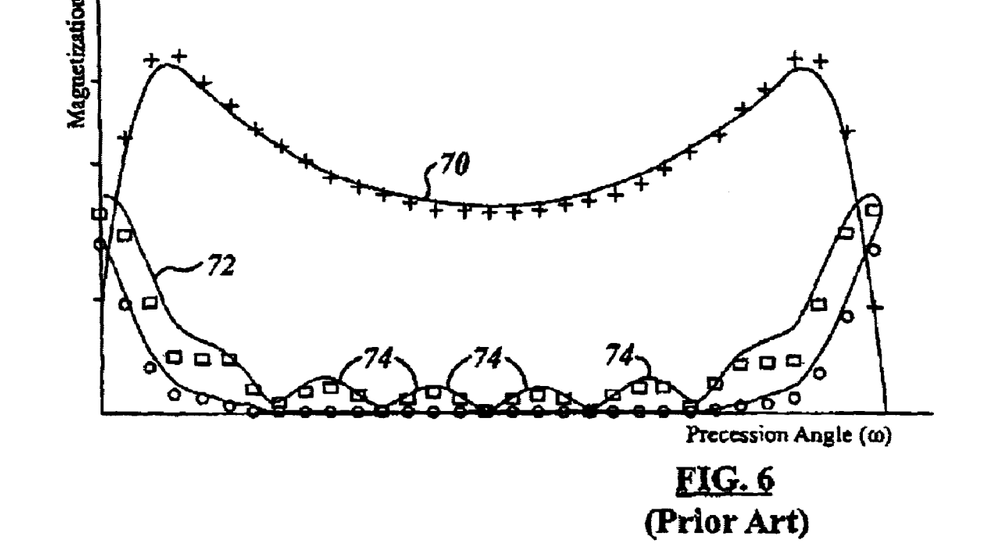
FIG. 6 is a plot of parallel and perpendicular magnetization components as a function of precession angle, as a result of the preparation phase of FIG. 4.

Referring now to FIG. 6, a plot of the parallel magnetization component and of the perpendicular magnetization component (or equivalently the resonance frequency offset) of magnetization $M_{SS}$ versus precession angle is shown. The parallel component and the perpendicular component are represented by curves 70 and 72, respectively. The parallel component 70 and the perpendicular component 72 are the result of the preparation phase 41 of the second method. An oscillation is obtained over time for the pulses 44, as a function of the frequency ω; this oscillation is illustrated by the lobes 74 of the perpendicular component 72. The oscillation is not negligible and ranges from approximately 5–10% of the value of the parallel component. In other words, the precession angle at the peak of each lobe 74 is approximately equal to 5–10% of the corresponding precession angle of the parallel component 70. Due to the oscillation, excitation-measurement sequences cannot be performed and accurate measurement data cannot be acquired until after a relaxation period has elapsed. Even with the application of an increased number of RF pulses in the preparation phase 41 the oscillation does not dampen, but rather an increase in the number of lobes results, each of which having the same amplitude. The increased number of lobes result as a function of frequency ω.

The present invention addresses and overcomes the issues described above. While the present invention is described with respect to a system and method of excitation during nuclear magnetic resonance (NMR) imaging, the present invention may be adapted for application in various magnetic resonance imaging (MRI) systems as well as in other systems known in the art. Also, although the present invention is described with respect to cardiac examinations, the present invention may be applied to other MRI examinations known in the art. The present invention may be applied to FSE, SSFP, and other fast sequencing techniques known in the art.

In the following description, various operating parameters and components are described for one constructed embodiment. These specific parameters and components are included as examples and are not meant to be limiting.

Figure 7:
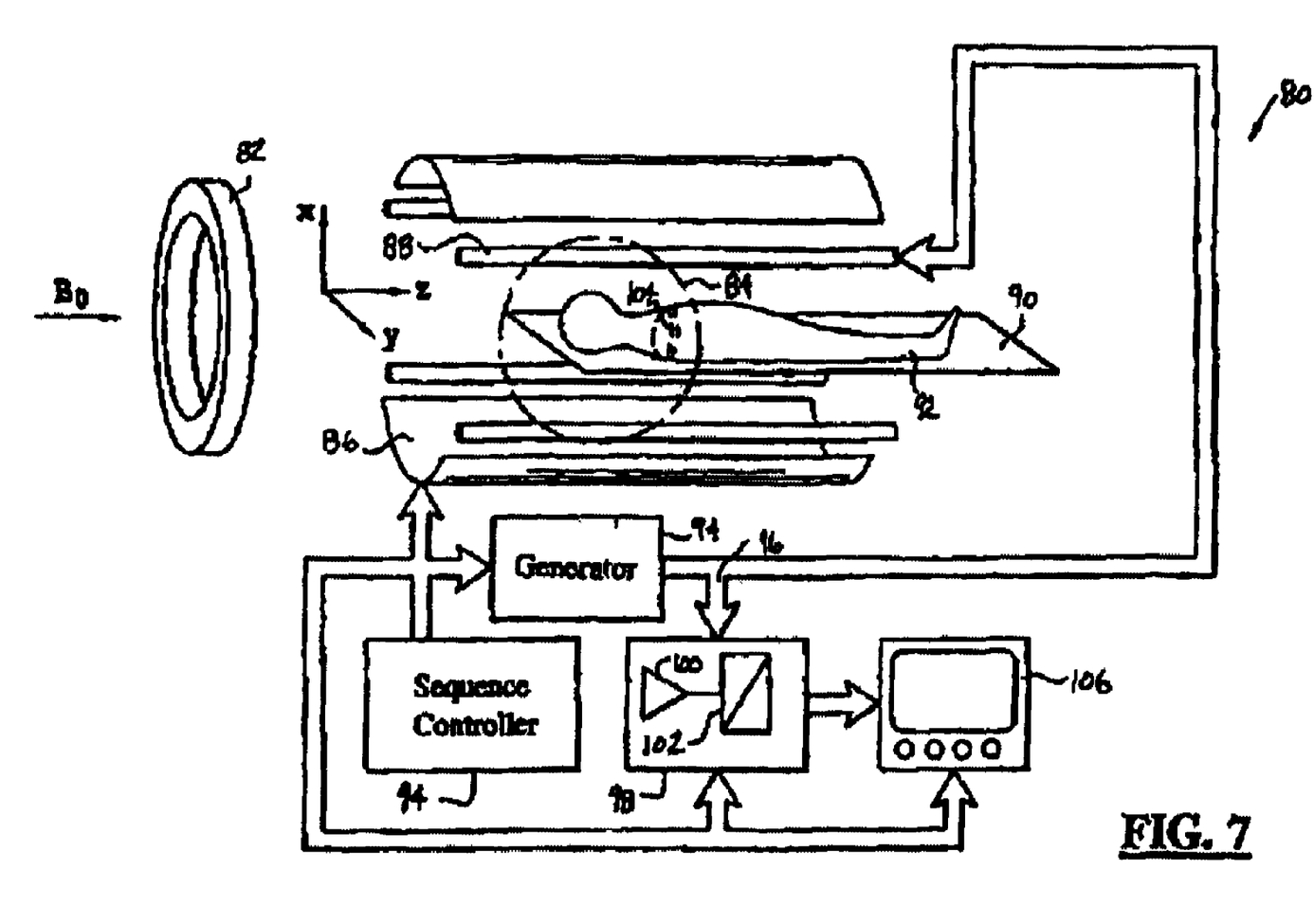
FIG. 7 is a perspective and block diagrammatic view of a magnetic resonance imaging system utilizing an excitation method in accordance with an embodiment of the present invention.

Referring now to FIG. 7, a perspective and block diagrammatic view of a MRI system 80 utilizing an excitation method in accordance with an embodiment of the present invention is shown. The MRI system 80 includes a B0 magnet 82, which provides an intense, continuous, and homogeneous magnetic field B0 in a magnetization region 84 along a longitudinal axis (z-axis). A magnetic gradient coil assembly 86 is sequentially pulsed to create a sequence of controlled gradients in the region 84 during a MRI data gathering sequence. The controlled sequential gradients are effectuated throughout the region 84. A RF coil assembly (antennae) 88 is also mounted around the region 84. The RF coil assembly 88 generates RF signals of suitable frequencies, which are transmitted into the region 84. Nuclear magnetic resonance (NMR) responsive RF signals are also received from the region 84 via the RF coil assembly 88.

A translatable table 90 within the region 84 supports a body 92, such as that of a patient. Throughout an examination period the body 92 remains subjected to the magnetic field B0. The RF coil assembly 88 is coupled to a generator 94 and is used to prompt the excitation of magnetic moments of the particles within the body 92 that are located in the region 84. In one embodiment of the present invention, the RF coil assembly 88 is a bar antenna that is capable of generating a rotating excitation field by phase-shifting excitation of each of the bars. A sequence controller 94 pulses the RF signals for excitation and manipulation of the magnetic resonance in selected dipoles of a portion of the body 92.

The excitations are temporary. At the end of the excitations, the RF coil assembly 88 receives a de-excitation, resonance, or measurement signal, which is transferred through a duplexer 96 to a signal processor 98. The signal processor 98 may include amplification and demodulation circuits 100 and processing circuits 102. The processing circuits 102 may shape and demodulate magnetic resonance signals emanating from the examined portion of the body 92 for image reconstruction and representative views on a display device, such as display device 106. A two-dimensional section 104 of the body 92 may be viewed on the display device 106.

In an examination, in order to obtain an image, multiple excitation-measurement sequences are performed. In each of the sequences, the gradient coil assembly 86 is used to apply encodings to a free precision signal of the magnetic moments. Generation of the encodings as well as the operations of the generator 94, the duplexer 96, the signal processor 98, and the display 106 are controlled by the sequence controller 94. The sequence controller 94 may be software based and include a program for performing the above-stated operations. The excitation-measurement sequences are programmed into the sequence controller 94. Thus, in the program, the characteristics of each of the operations to be performed in the sequences can be simply modified to alter the nature of the experimentation undertaken.

Figure 8:
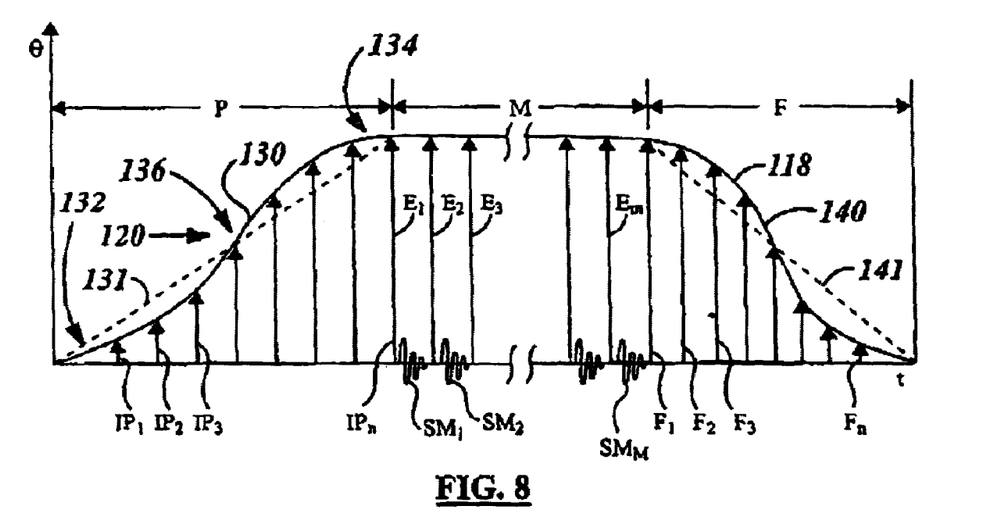
FIG. 8 is a graph illustrating excitation flip angle amplitudes in accordance with an embodiment of the present invention.
Figure 11:
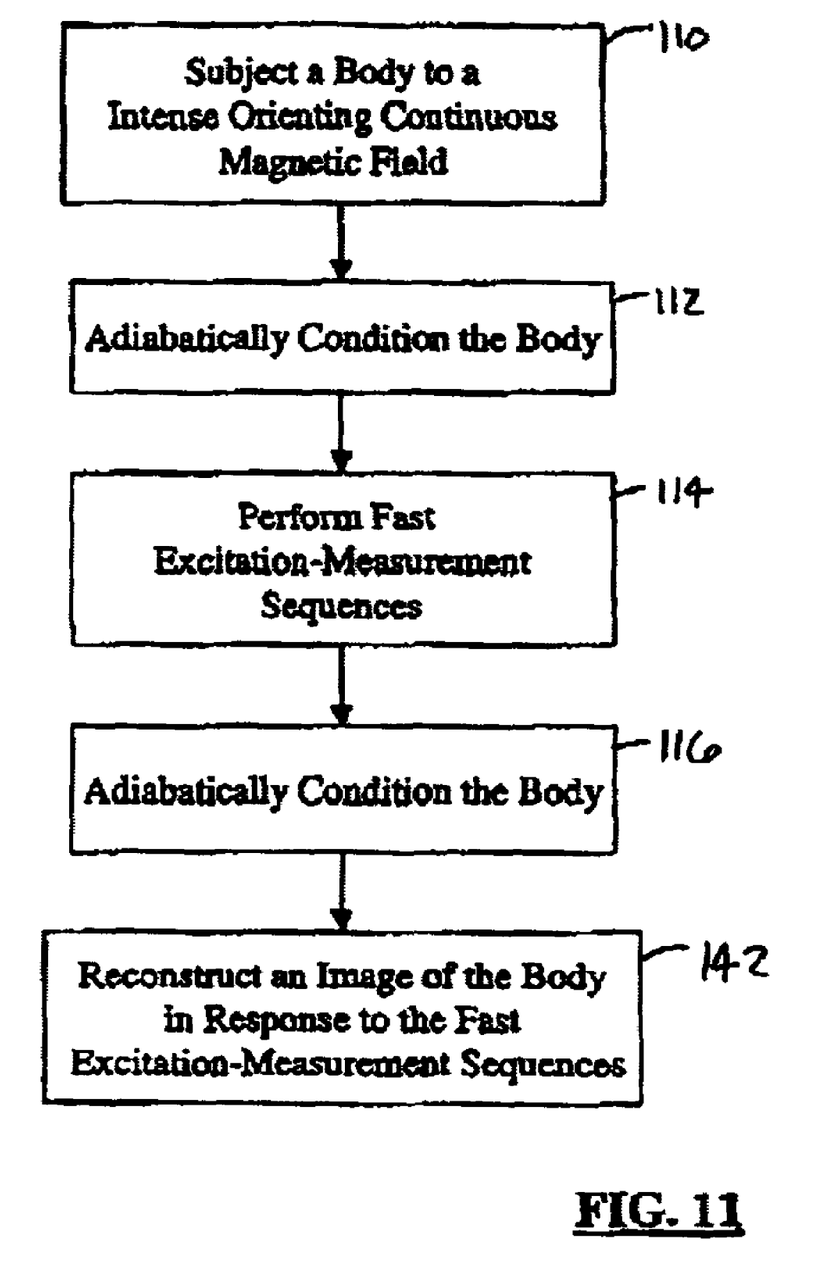
FIG. 11 is a logic flow diagram illustrating an excitation method for a NMR examination in accordance with an embodiment of the present invention.

Referring now to FIGS. 8 and 11, a graph illustrating excitation flip angle amplitudes and a logic flow diagram illustrating an excitation method for a NMR examination, are shown, in accordance with an embodiment of the present invention.

In step 110, the body 92 is subjected to the intense orienting continuous magnetic field B0.

The following steps 112–116 are performed with respect to an excitation flip angle amplitude curve 118. The amplitude curve 118 has a preparation phase P, a measurement phase M, and a final phase F, which are described in further detail below.

In step 112, the body 92 is conditioned by the preparation phase P with RF pulses $IP_1$–$IP_n$. The preparation phase P corresponds with a first portion 120 of the amplitude curve 118. Progression of the RF pulses $IP_1$–$IP_n$ can be determined according to the Shinnar Le Roux (SLR) algorithm presented by J. Pauly, P. Le Roux, D. Nishimura, and A. Macovski in "Parameter relations for the Shinnar-Le Roux selective excitation pulse design algorithm", IEEE Trans. Med. Imaging 10,53–65 (1991) as well as in the European patent EP-B-0 316 312.

The sequence controller 94 is capable of and produces excitations with increasing amplitudes. The rate of the excitations may be for example approximately 3 ms with inter-pulse repetition time of up to approximately 2.5 ms. Each of the RF pulses $IP_1$–$IP_n$ may have an elementary duration of approximately 600 μs. A sample progression of the increase in amplitudes is illustrated by the preparation phase P of the amplitude curve.

Figure 5A:
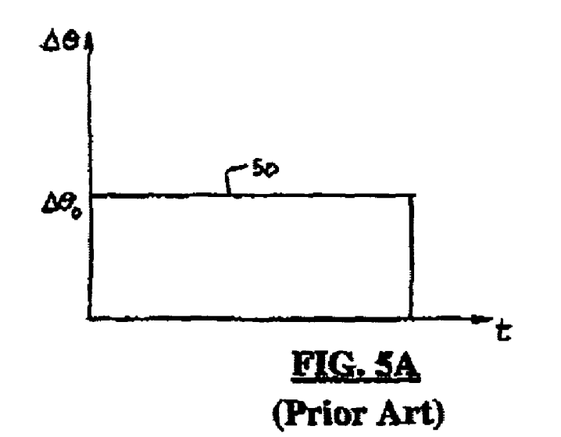
FIG. 5A is a graph illustrating flip angle variation versus time for the amplitude curve of FIG. 4.
Figure 5B:
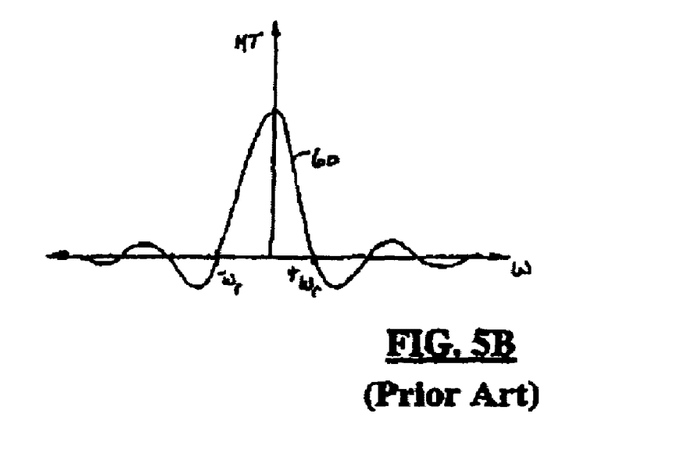
FIG. 5B is a graph illustrating the Fourier Transform of the flip angle variation curve of FIG. 5A.

The constant variation of the flip angles Δθ of FIG. 5A in effect is converted into a quasi-adiabatic variation, here-inafter referred to as an adiabatic variation. The RF pulses $IP_1$–$IP_n$ are rapidly applied and are of the adiabatic sequence type.

The adiabatic character is obtained by an effective dampening by apodization of the constant amplitude variation shown in FIG. 5A. The consequence of this apodization is that a transversal component MT of the magnetization is at a null when the magnetization approaches a direction of equilibrium, such as direction of the steady-state magnetization $M_{SS}$. The oscillation energy illustrated in FIG. 6, by the lobes 74, is expressed along the transversal component MT. The adiabatic preparation phase reduces the transversal component MT to a small value, thus, eliminating a need to rely on stabilization by relaxation or dispersion phenomena. The transversal component MT does not arise or arises to such a small extent that it no longer needs to be neutralized. Also, there is no need to wait for the transversal component MT to dampen, unlike in the method of Nishimura.

The value of the transversal component MT is equal to the Fourier Transform of the variation in the flip angles Δθ between the RF pulses $IP_1$–$IP_n$. This comparison between the transversal component MT and the variation in flip angle Δθ results from the assumption that during an excitation pulse of the preparation phase P the parallel component MP remains substantially the same with little variation.

Figure 9A:
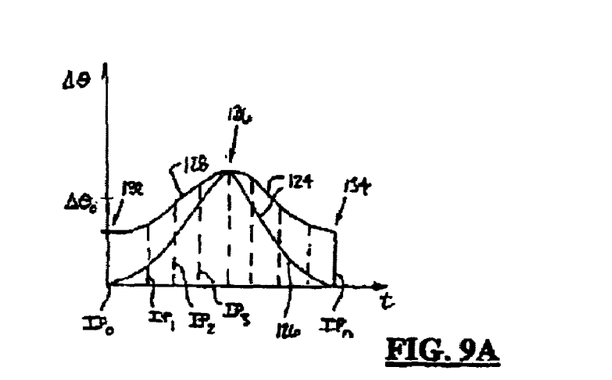
FIG. 9A is a graph illustrating flip angle variation versus time for a preparation phase of the amplitude curve of FIG. 8 in accordance with multiple embodiments of the present invention.
Figure 9B:
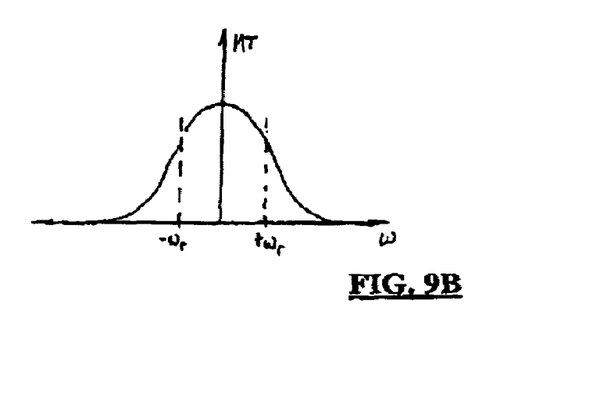
FIG. 9B is a graph illustrating the Fourier Transform of the flip angle variation curve of FIG. 9A.

Referring now also to FIG. 9A, a graph illustrating flip angle variation versus time for the preparation phase P is shown. The change or variation in the flip angle Δθ for the preparation phase P, of the embodiment of FIGS. 8–11, varies due to the apodization of the constant amplitude variation curve 50 of FIG. 5A. This is shown by the curves 124. In one example embodiment of the present invention, a Hanning apodization is utilized, as illustrated by curve 126. The first low value RF pulse $IP_0$ is realized with high precision to maintain stability. In another example embodiment, a Kaiser Bessel apodization is utilized, represented by curve 128. An example dampening coefficient value for the Kaiser Bessel apodization is a dampening coefficient value β of 3. Due to nonlinear responses, a dampening coefficient value β of 5 provides approximately the same dampening benefits as that of a dampening coefficient value β of 3, but a smaller first RF pulse amplitude $IP_0$ becomes difficult to realize.

In a first example, when the flip angle θ of the magnetization used is approximately equal to 60°, sufficient dampening of the transversal component MT is provided by application of eight RF pulses, such as pulses $IP_1$–$IP_n$. The measurement signal is usable upon application of the seventh RF pulse $IP_7$. This is shown in FIG. 8 by the last RF pulse $IP_n$, in the preparation phase P, being the same as the first excitation pulse $E_1$, in the measurement phase M. In a second example, when the flip angle θ is high, for example, when the flip angle is 180°, sufficient dampening is provided by the application of ten RF pulses (not shown) in the preparation phase P. The measured signal is usable upon application of the ninth RF pulse. In the above two stated examples, the transversal components have been converted into parallel components and steady-state magnetization $M_{SS}$ has been reached upon application of the last RF pulses in each of the preparation phases. The conversion of the transversal components into parallel components allows for generation of useful measurement signals.

Rather than the RF pulses $IP_1$–$IP_n$ increasing at a constant rate, as shown by the ramp curve 42 of FIG. 4, they increase in the form of a sigmoidal ramp 130 about an inclined ramp 131. The variation of the flip angle θ for the RF pulses $IP_1$–$IP_n$ is smaller at a beginning 132 and at an end 134 of the preparation phase P relative to the variation between pulses 44. The same flip angles at the beginning 132 and at the end 134 result in the corresponding transversal component MT being small. Also, in a middle portion 136 of the preparation phase P, the slope of the sigmoidal ramp 130 is sharper relative to the slope of the ramp 42. The sharper slope results in the corresponding variation during the middle portion 136 and the corresponding magnitude of the transversal component MT being large. Note that by the use of a sigmoidal ramp that none of the flip angle amplitudes of each excitation pulse $IF_1$–$IF_8$ is greater than the final flip angle expected, unlike that of Hargreaves where the final flip angle is 60° and some of the flip angle amplitudes of the preparation pulses 22 are greater than 60°.

Figure 10:
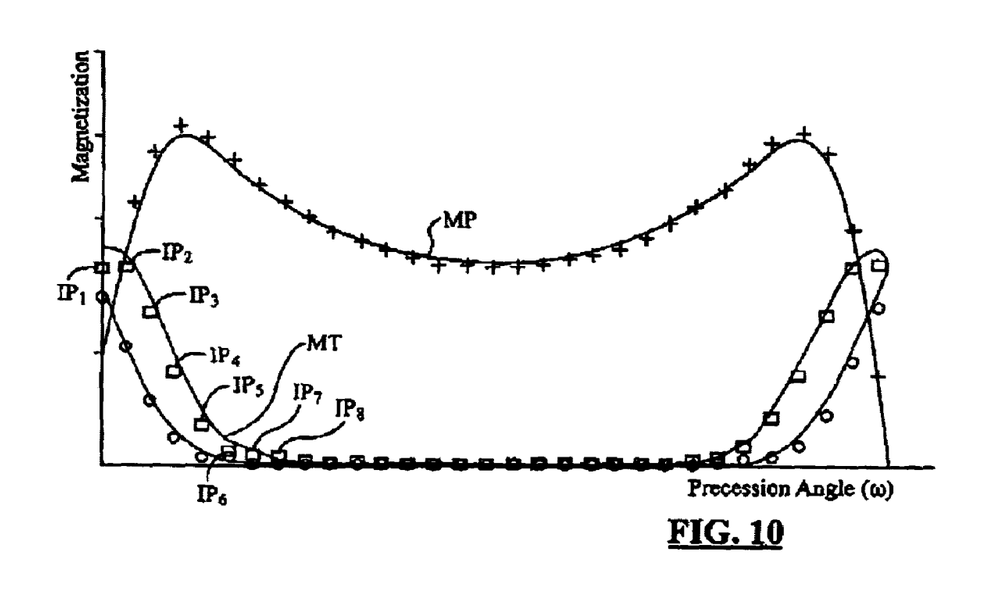
FIG. 10 is a plot of parallel and perpendicular magnetization components as a function of precession angle, as a result of the preparation phase of FIG. 8.

In comparing the variation curve 50 of FIG. 5A with the variation curves 124 of FIG. 9A, the variation curves 124 begin with the variation values that are less than the constant variation $Δθ_0$ of FIG. 5A. The variation curves 124 transition to be greater than the constant variation $Δθ_0$ towards the middle 136 and than transition once again to being less than the constant variation $Δθ_0$ towards the end 134. The apodization of the constant varying flip angles allows the use of approximately eight RF pulses rather than the use of fourteen RF pulses as used in the method of Nishimura. The transversal component MT is dampened to approximately zero after application of the eight RF pulses $IP_1$–$IP_8$, as shown in FIG. 10. As shown in FIG. 10, it can be seen that a useable measurement can be received upon application of the RF pulse $IF_g$. This is unlike the method corresponding to FIG. 6, where due to the oscillation, no useful measurement can be taken.

In step 114, fast excitation-measurement pair sequences are performed. The body 92 is excited by a series of excitation pulses $E_1-E_m$ in the presence of gradient pulses, which is referred to as phase M. In between each of the excitation pulses $E_1-E_m$ measurement signal is generated. The measurement signals are designated as $SM_1-SM_m$. The number of preparation pulses, excitation pulses, and measurement pulses may vary and are not necessarily equal in number.

A hundred of excitation pulses may be performed. With each elementary excitation lasting approximately 600 µs. During the remaining time between excitation pulses, which may be approximately 2 ms, the measurement signals $SM_1-SM_m$ are emitted from the body in response to the excitation pulses $E_1-E_m$.

Naturally, during the elementary periods one or more gradient coils within the gradient coil assembly 86 are switched over to obtain an image in a selected section. In a duration of time, approximately equal to the time T1 and the time T2, of approximately 300 ms, an image may be acquired for an entire section in 2D. This overcomes the issues presented by the variation of the state of a heart during a 3D acquisition.

In step 116, the body 92 is conditioned during the final phase F, which is similar to the conditioning performed in the preparation phase. RF pulses $F_1-F_n$ in the finishing phase F are also of the adiabatic type. The RF pulses $F_1-F_n$ are generated in the form of an inverted sigmoidal curve 140, about a declined ramp 141, or in effect an inversion of the sigmoidal curve 130. The inverted curve 140 allows for the flip angle θ to be reduced to zero and to transition from the steady-state magnetization $M_{SS}$ to the initial magnetization state $M_0$.

As a result of the preparation phase P, the measurement phase M, and the finishing phase F the body 92 can be excited with another excitation method or sequence that is the same or different from that of the method described with respect to FIG. 11. A traditional sequence that is not fast or another fast sequence may be performed. Other parameters of the body 92 may then be measured.

Any excitation method performed after the excitation method of FIG. 11, is independent from and has the utility of the excitation method of FIG. 11, due to the restoration of the magnetization to the initial or original state $M_0$. Also, there is no waiting for a relaxation period to pass between the excitation methods.

In step 142, an image is reconstructed in response to the 2D plane section acquisition of step 114.

The above-described steps are meant to be illustrative examples; the steps may be easily modified depending upon the application.

The character of the magnetization during the preparation phase and the measurement phase of the present invention is accurately controlled. No dispersal of the contributions of the different perpendicular components is performed. By performing a dispersal of the perpendicular components the value of the longitudinal component of the steady-state magnetization $M_{SS}$ is undesirably reduced. Also, a dispersal may cause an uncontrollable situation in which one would be required to wait for the relaxation of the perpendicular component. This wait may be the equivalent of three to five times the duration of the time T2.

The present invention provides for a fast sequence NMR type examination utilizing a flip excitation having a progression that is adiabatic. The adiabatic progression prevents lose of energy and concentrates a majority of the excitation energy in a longitudinal component of the magnetization used for measurement purposes. In so doing, the value of the parallel component is not negatively affected by an anarchical contribution of a perpendicular component, which can render information attained from the parallel component unusable and unreliable.

The above-described apparatus and method, to one skilled in the art, is capable of being adapted for various applications and systems known in the art. The above-described invention can also be varied without deviating from the true scope of the invention.

What is claimed is:

1. A method of excitation for use during an NMR examination comprising:
   subjecting a body to an orienting magnetic field;
   adiabatically conditioning at least a portion of said body with a first plurality of radio frequency pulses;
   exciting said body with a second plurality of radio frequency pulses in a presence of gradient field pulses; and
   receiving at least one resonance signal emitted from said body in response to said second plurality of radio frequency pulses.

2. A method as in claim 1 wherein adiabatically conditioning at least a portion of said body comprises dampening by apodization a magnetization flip angle to cancel a transversal component of a magnetization.

3. A method as in claim 2 wherein said dampening is in a form of a Kaisar Bessel type apodization.

4. A method as in claim 3 wherein said Kaisar Bessel type apodization has a dampening coefficient approximately equal to 3.

5. A method as in claim 2 wherein said dampening is in a form of a Hanning apodization.

6. A method as in claim 1 wherein said first plurality of radio frequency pulses are determined via a Shinnar Le Roux algorithm.

7. A method as in claim 1 wherein said second plurality of radio frequency pulses are of a steady-state free precession decay type.

8. A method as in claim 1 wherein said second plurality of radio frequency pulses are of a fast spin echo type.

9. A method as in claim 1 wherein said at least one resonance signal is of a steady-state free precession decay type.

10. A method as in claim 1 wherein said at least one resonance signal is of a fast spin echo type.

11. A method as in claim 1 wherein said first plurality of radio frequency pulses have flip angle amplitudes that are less than a final flip angle amplitude used to attain a magnetization of equilibrium.

12. A method as in claim 1 wherein number of pulses within said first plurality of radio frequency pulses is less than or equal to 10.

13. A method as in claim 1 wherein number of pulses within said first plurality of radio frequency pulses is 8 for a magnetization flip angle of approximately 60°.

14. A method as in claim 1 wherein magnetization flip angle as a result of said first plurality of radio frequency pulses is approximately 60°.

15. A method as in claim 1 wherein said at least one resonance signal corresponds to a 2D plane section of said body.

16. A method as in claim 1 wherein said body is of a cardiac type.

17. A method as in claim 1 further comprising conditioning said body via an adiabatic finishing of radio frequency pulses.

18. A method as in claim 17 wherein said adiabatic finishing of radio frequency pulses are the inverse of said first plurality of radio frequency pulses.

19. A method as in claim 17 further comprising exciting said body with a non-fast excitation-measurement sequence.

20. A magnetic resonance imaging system comprising:
a magnet subjecting a body to an orienting magnetic field; and
an antennae adiabatically conditioning at least a portion of said body with a first plurality of radio frequency pulses, said antennae exciting said body with a second plurality of radio frequency pulses in a presence of gradient field pulses;
said antennae receiving at least one resonance signal emitted from said body in response to said second plurality of radio frequency pulses.

21. A method of excitation for use during an NMR examination comprising adiabatically conditioning at least a portion of a body with a progression of radio frequency pulses via a dampening by apodization of magnetization flip angles in preparation for an NMR measurement.

22. A method as in claim 21 wherein adiabatically conditioning at least a portion of a body comprises applying said progression of radio frequency pulses in a sinusoidal manner.

23. A method as in claim 22 wherein said progression of radio frequency pulses are applied in a sinusoidal manner about a ramp.

* * * * *